United States Patent [19]

Kostenbauder

[11] Patent Number: 4,754,130
[45] Date of Patent: Jun. 28, 1988

[54] METHOD AND MEANS FOR DETECTING OPTICALLY TRANSMITTED SIGNALS AND ESTABLISHING OPTICAL INTERFERENCE PATTERN BETWEEN ELECTRODES

[75] Inventor: Adnah G. Kostenbauder, Palo Alto, Calif.

[73] Assignee: Stanford University, Stanford, Calif.

[21] Appl. No.: 925,199

[22] Filed: Oct. 31, 1986

[51] Int. Cl.$^4$ .............................................. H01J 40/14
[52] U.S. Cl. ............................ 250/211 R; 250/211 J
[58] Field of Search ................ 250/211 J, 211 R, 550; 330/4.3

[56] References Cited

U.S. PATENT DOCUMENTS 3,590,344  6/1971  Roberts ........................... 250/211 J
3,937,580  2/1976  Kasdan ................................ 250/550
3,957,376  5/1976  Charsky et al. ..................... 250/550
4,282,510  8/1981  Southgate ........................... 250/550

Primary Examiner—David C. Nelms
Assistant Examiner—Michael Messinger
Attorney, Agent, or Firm—Flehr, Hohbach, Test, Albritton & Herbert

[57] ABSTRACT

A photodetector for detecting signal pulses transmitted in an optical carrier signal relies on the generation of electron-hole pairs and the diffusion of the generated electrons and holes to the electrodes on the surface of the semiconductor detector body for generating photovoltaic pulses. The detector utilizes the interference of optical waves for generating an electron-hole grating within the semiconductor body, and, by establishing an electron-hole pair maximum at one electrode and a minimum at the other electrode, a detectable voltaic pulse is generated across the electrode.

14 Claims, 2 Drawing Sheets

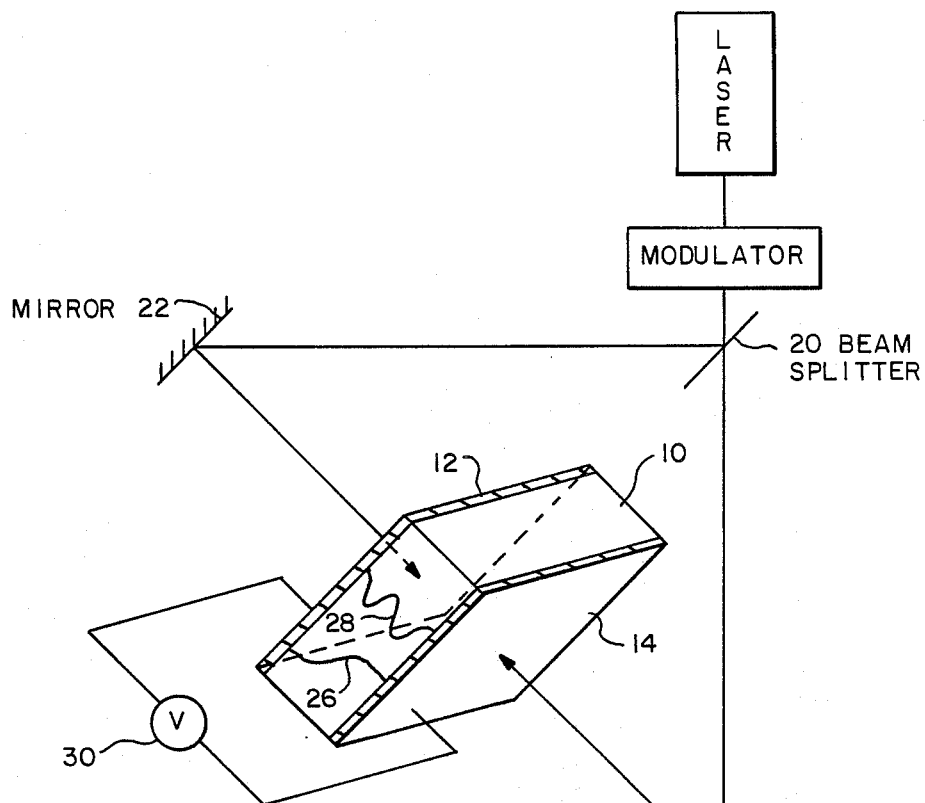
FIG.—1
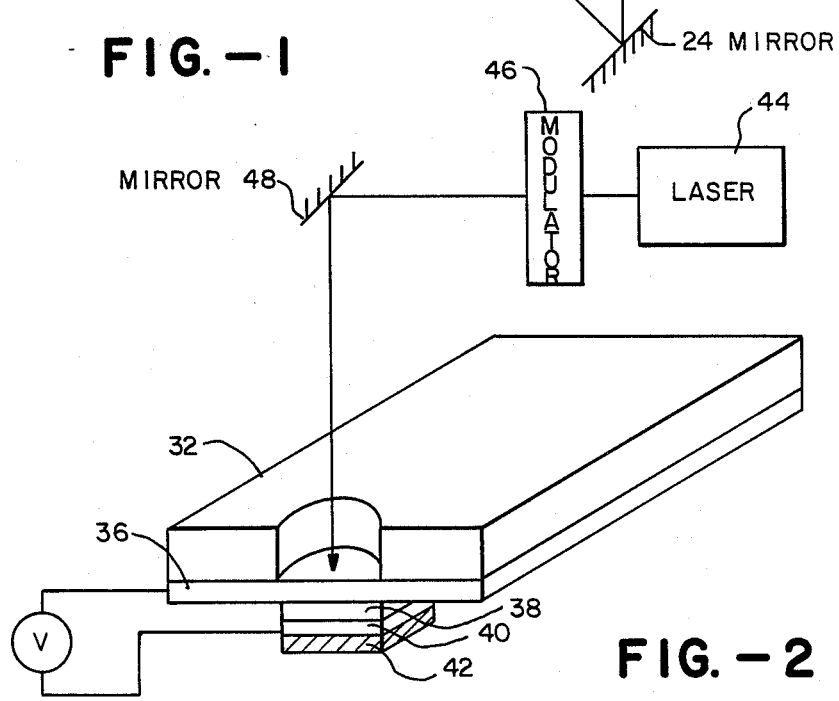
FIG.—2

METHOD AND MEANS FOR DETECTING OPTICALLY TRANSMITTED SIGNALS AND ESTABLISHING OPTICAL INTERFERENCE PATTERN BETWEEN ELECTRODES

The U.S. Government has rights in the invention disclosed and claimed herein pursuant to Department of Energy Contract No. W-7405-ENG-48.

BACKGROUND OF THE INVENTION

This invention relates generally to optical signal transmission, and more particularly the invention relates to an improved photodetector and method of detecting optically transmitted signals.

The transmission of data optically through optical fibers permits the rapid transfer of large quantities of information. While a television channel, for example, transmits information in a bandwidth of 6 MHz, light, in theory, has a bandwidth that is many million times that of a TV channel. Potentially, using optical transmission, 10 trillion bits of information could be sent in a second.

However, in order to use light to send large amounts of data at high speed, one needs very short light pulses and therefore very fast photodetectors. Conventional photodetectors are either very small or very inefficient, and are therefore limited in their ability to measure the intensity of light with fine time resolution.

SUMMARY OF THE INVENTION

Accordingly, an object of the invention is an improved method of detecting optically transmitted signals.

Another object of the invention is an improved high-speed photodetector.

Still another object of the invention is an improved method and means for optically transmitting data.

Briefly, a photodetector in accordance with the invention includes a semiconductor body with electrodes positioned on at least one surface. Means is provided for transmitting optically encoded signals into the semiconductor body whereby photovoltaic pulses are produced. The impulses result from the diffusion of electrons to the electrodes in response to a grating of photoexcited electron-hole pairs. The grating is established whereby a maximum of the carrier density occurs at one electrode and a minimum occurs at the other electrode.

In accordance with one embodiment of the invention, the two electrodes are optically transparent. The optical carrier signal is split, and the two signal components are transmitted through the electrodes and interfere inside of the semiconductor body to establish the grating.

In accordance with another embodiment of the invention, one electrode is transparent and one electrode is reflective. The optical carrier signal is transmitted through the transparent electrode into the semiconductor body and is reflected off the other electrode. The incoming signal and the reflected signal interfere to establishing the grating.

In accordance with another embodiment of the invention, the optical carrier signal is split into components such as by a Ronchi ruling, and the components are then imaged onto the semiconductor body between the electrodes. The components interfere within the semiconductor body to establish the grating. While physical thickness of the semiconductor body and electrodes are critical in the first two embodiments, the dimensions are not critical in the third embodiment.

A measure of the photovoltaic pulses is obtained by suitable means such as a high-speed sampling oscilloscope or by electro-optic sampling.

The invention and objects and features thereof will be more readily apparent from the following detailed description and appended claims when taken with the drawing.

BRIEF DESCRIPTION OF THE DRAWINGS

FIG. 1 is a schematic diagram of a photodetector in accordance with one embodiment of the invention.

FIG. 2 is a schematic diagram of a photodetector in accordance with another embodiment of the invention.

DETAILED DESCRIPTION OF ILLUSTRATIVE EMBODIMENTS

Figure 3:
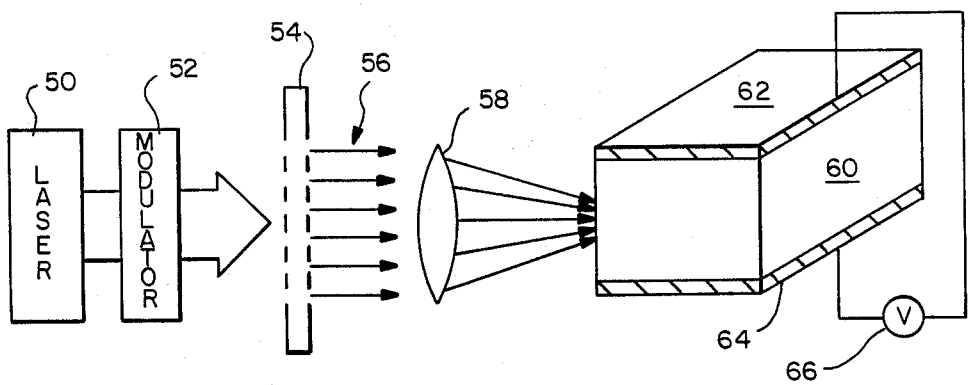
FIG. 3 is a schematic diagram of a photodetector in accordance with yet another embodiment of the invention.

FIGS. 1-3 are schematic representations of three embodiments of the invention. In each of the embodiments, the photodetector relies on diffusion of electrons and holes to produce very short (i.e., less than one picosecond with counterpropagating optical beams) photovoltaic impulse responses. This is to be contrasted with the conventional photodetectors which rely upon large electric fields and small geometries to allow all of the photocarriers to be swept into the contacts in a short time. The detector in accordance with the present invention does not require an electrical bias or recombination as in the prior-art high speed devices.

Referring now to FIG. 1, a photodetector in accordance with one embodiment of the invention comprises an optically thin slab of semiconductor material 10, single crystal silicon or gallium arsenide for example, with optically transparent electrodes 12 and 14 provided on opposing surfaces thereof. Suitable electrode material can be a very thin coating of gold on silicon material or aluminum gallium arsenide on gallium arsenide material. The electrode spacing as determined by the slab thickness must be an odd integer times one-fourth the carrier signal wavelength in the slab. It will be appreciated that the two beams may be offset by an angle of $2\theta$ whence the appropriate thickness is as above divided by $\cos \theta$. In this embodiment a coherent lightbeam from laser 16 is encoded by modulator 18 and then split by beam-splitter 20. The two beams from beam-splitter 20 are then directed along equal length paths and directed by mirrors 22 and 24 to the semiconductor body 10 through the optically transparent electrodes 12 and 14. The two beams interfere within the semiconductor body and establish an electron-hole pair grating therein. By positioning the semiconductor body whereby an intensity maximum occurs at one electrode and a minimum at the other electrode, as illustrated schematically at 26 and 26, a current is generated by the diffusion of electrons and holes with the generated current being proportional to the difference in the electron-hole pair densities at the two electrodes. The sinusoidal distribution of the electron-hole pairs, and thus the current, decays rapidly by diffusion. The photovoltaic pulses generated by the diffusion of electrons to the electrodes can then be measured by means of a high-speed sampling oscilloscope 30, for example. For common materials, such as silicon and gallium arsenide, and visible wavelengths, the response time can be as short as a hundred femtoseconds. This is much shorter than the impulse responses of conventional fast photodetectors.

FIG. 2 is a schematic diagram of another embodiment of a photodetector of the present invention. In this embodiment, the active detector portion is fabricated on a supporting substrate 32 of gallium arsenide, for example. The substrate 32 is etched using conventional semiconductor processing techniques to form a window 34 therein. At the base of window 34 is an optically transparent electrode 36 which can be N++ gallium arsenide. The contact 36 may also function as an etch stop in the fabrication of the window 34. On the surface of the contact 36 is an active layer 38 of gallium aluminum arsenide, and on the opposing surface of layer 38 is a second electrode 40 of N++ gallium arsenide. Finally, over the surface of electrode 40 is a reflective metal layer 42 of aluminum, for example. The active layer 38 and the electrode 40 have approximately the same dimensions as the window 34.

In this embodiment, a coherent light beam from laser 44 is modulated at 46 and then directed by mirror 48 through the window 34 and transparent contact 36 to the active layer 38. The light reflects off of mirror surface 42, and the reflected light interferes with the impinging light directed by mirror 48 to establish an electron-hole grating between electrodes 36 and 40.

In the embodiments of FIGS. 1 and 2, the thickness of the semiconductor slab must be an odd integer times a quarter of the wavelength of the optical carrier signal in the material. Thus, fabrication of the semiconductor body can be critical. However, FIG. 3 is another embodiment of a photodetector in accordance with the invention in which the thickness of the semiconductor material is not critical because the imaging system can be adjusted to compensate for thickness variations. In this embodiment, a beam from laser 50, after passing through modulator 52, is divided into a number of components by suitable means such as a Ronchi ruling 54. The components 56 of the laser beam are then imaged by means of a lens 58 on a semiconductor body 60. Electrodes 62 and 64 are provided on opposing surfaces of the semiconductor body 60, and a signal detector 66 is connected to the electrodes to measure the photovoltaic pulses generated thereon. In this embodiment the components 56 created by the Ronchi ruling 54 generate the electron-hole grating within the semiconductor body 60.

Figure 4:
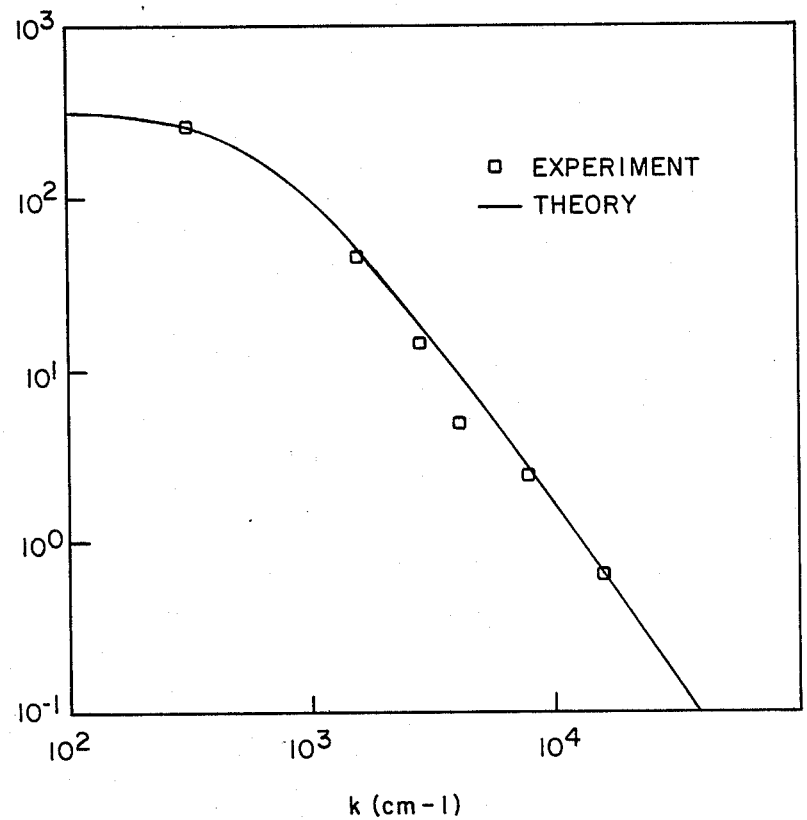
FIG. 4 is a plot illustrating time constant vs. grating K vector based on theoretical calculations and on experimental measurements.

Experimental results using a photodetector in accordance with the invention have proved to be consistent with theoretical results. FIG. 4 is a plot of time constant vs. grating k vector with the solid line 70 represented the theoretical results and the experimental results being denoted by squares.

These measurements were made on a silicon sample of the type shown in FIG. 3. In the experimentally accessible region for our apparatus the impulse response is given by:

$$e^{-(D_a K^2 + 1/\tau)t} \quad t \geq 0$$
$$0 \quad t < 0$$

where $D_a$ is the material's ambipolar diffusion constant, $\tau$ is the carrier lifetime, and K is $2\pi$ divided by the period of the photocarrier grating. The various K's were produced by using Ronchi rulings of various periods and imaging systems of various magnifications. The measurements go from the regime where the response time is dominated by recombination (260 nanoseconds response at $K=314$ cm$^{-1}$) to that where the diffusion time dominates the problem (the remaining points). The fastest time (650 ps at $K=15700$ cm$^{-1}$) is almost a factor of two faster than the saturation velocity induced transit time limit (0.011 cm/($10^7$ cm/s)=1.1 ns). One of the important aspects of the photodetector is its ability to operate more quickly than the transmit time limit, while still providing high quantum efficiency.

An optical communications system using a photodetector in accordance with the presence invention should be capable of producing detectable light pulses that last one picosecond, or a millionth of a millionth of a second, thus, more fully utilizing the bandwidth of a light carrier signal. While the invention has been described with reference to specific embodiments, the description is illustrative of the invention and is not to be construed as limiting the invention. For example in the embodiment of FIG. 1, two lasers may be applied and mixed down by the moving interference pattern within the semiconductor body. Further, while in the preferred embodiments the two electrodes are on opposing surface, the two electrodes can be in spaced alignment on a single surface, Thus, various modifications and applications will occur to those skilled in the art without departing from the true spirit and scope of the invention as defined by the appended claims.

What is claimed is:

1. A photodetector for detecting signal pulses transmitted in an amplitude modulated carrier signal comprising
    a semiconductor body,
    a pair of electrodes on said body,
    means for directing an amplitude modulated optical carrier signal into said body whereby an optical interference pattern is established between said electrodes resulting in a spatially and temporally varying density of optically injected electron-hole pairs between said electrodes, and
    means for measuring photovoltaic pulses across said electrodes resulting from said electron-hole pairs.

2. The photodetector as defined in claim 1 wherein said electrodes are optically transparent and whereby said means for directing an optical carrier signal includes a beam-splitter for splitting an optical carrier signal into two components, and means for directing said two components through said electrodes into said semiconductor body for interfering and establishing said pattern.

3. A photodetector as defined in claim 1 wherein one electrode is optically transparent and one electrode is optically reflective, said means for directing an optical carrier signal includes means for directing said optical carrier signal into said semiconductor body through said transparent electrode whereby the carrier signal and a reflection of said carrier signal interfere within said body to establish said pattern.

4. The photodetector as defined in claim 1 wherein said means for directing an optical carrier signal into said body includes means for establishing a plurality of carrier signal components and means for focusing said carrier signal components in said semiconductor body, whereby said components interfere and establish said pattern.

5. The photodetector as defined by claim 4 wherein said means for establishing a plurality of carrier components comprises an external grating structure such as a Ronchi ruling and an imaging system.

6. The photodetector as defined by claim 1 wherein two optical signals are directed into said body whereby said body functions as a mixer for said two optical signals.

7. The photodetector as defined by claim 1 wherein said electrodes are on opposing surfaces of said body.

8. A method of detecting signal pulses transmitted in an amplitude modulated optical carrier signal comprising the steps of
providing a semiconductor body having electrodes on at least one surface,
directing said amplitude modulated optical carrier signal into said semiconductor body whereby an optical interference pattern is established between said electrodes resulting in a spatially and temporally varying density of optically injected electron-hole pairs between said electrodes, and
measuring photovoltaic pulses across said electrodes.

9. The method as defined by claim 8 wherein said step of directing said optical carrier signal to said semiconductor body creates interference patterns in said optical carrier signal between said electrodes.

10. The method as defined by claim 9 wherein said step of directing said optical carrier signal includes splitting said optical carrier signal into two components and directing said two components into said semiconductor body whereby said two components interfere.

11. The method as defined by claim 9 wherein said step of directing said optical carrier signal includes directing said optical carrier signal into said body, reflecting said optical signal off a reflective surface and back into said semiconductor body, whereby said optical carrier signal and said reflected optical carrier signal interfere.

12. The method as defined by claim 9 wherein said step of directing said optical carrier signal includes establishing a plurality of components of said optical carrier signal and imaging said components in said semiconductor body whereby said components establish said pattern.

13. The method as defined by claim 8 wherein said semiconductor body has two electrodes on opposing surfaces.

14. The method as defined by claim 8 wherein said semiconductor body has two electrodes on one surface.

* * * * *